US012225102B2

(12) United States Patent
Shido (10) Patent No.: US 12,225,102 B2
(45) Date of Patent: Feb. 11, 2025

(54) SYNCHRONIZATION CIRCUIT, SEMICONDUCTOR MEMORY DEVICE, AND SYNCHRONIZATION METHOD FOR SYNCHRONIZING WITH SMALL CIRCUIT SCALE

(71) Applicant: Winbond Electronics Corp., Taichung (TW)

(72) Inventor: Taihei Shido, Yokohama (JP)

(73) Assignee: WINDBOND ELECTRONICS CORP., Taichung (TW)

( * ) Notice: Subject to any disclaimer, the term of this patent is extended or adjusted under 35 U.S.C. 154(b) by 126 days.

(21) Appl. No.: 17/953,445

(22) Filed: Sep. 27, 2022

(65) Prior Publication Data
US 2023/0114844 A1    Apr. 13, 2023

(30) Foreign Application Priority Data

Oct. 7, 2021  (JP) .................................. 2021-165180

(51) Int. Cl.
*H04L 7/00*    (2006.01)
(52) U.S. Cl.
CPC .......... *H04L 7/0041* (2013.01); *H04L 7/0037* (2013.01)
(58) Field of Classification Search
CPC ... H04L 7/0037; H04L 7/0041; H04L 7/0045; H04L 7/033; H04L 7/0008; G06F 1/10;
(Continued)

(56) References Cited

U.S. PATENT DOCUMENTS 7,548,106 B2 *  6/2009  Yoon .......................... G11C 7/22
                                                                      327/292
8,634,259 B2 *  1/2014  Kishimoto ............... G11C 7/10
                                                                      365/194

(Continued)

FOREIGN PATENT DOCUMENTS

CN          111262562 A      6/2020
KR    10-2005-0085801 A      8/2005
                (Continued)

OTHER PUBLICATIONS

Korean Office Action for Korean Application No. 10-2021-0153456, dated Jan. 26, 2024, with English translation.

*Primary Examiner* — Betsy Deppe
(74) *Attorney, Agent, or Firm* — Birch, Stewart, Kolasch & Birch, LLP (57) ABSTRACT

A synchronization circuit, a semiconductor storage device, and a synchronization method provided herein, which are capable of performing synchronization on a small circuit scale, includes: a first delay circuit delaying a input synchronization signal by a first predetermined time to generate a first delay synchronization signal; a second delay circuit delaying the first delay synchronization signal by a second predetermined time to generate a second delay synchronization signal; a first synchronization circuit outputting a first output data generated by synchronizing the input data with the input synchronization signal; a second synchronization circuit outputting a second output data generated by synchronizing the input data with the first delay synchronization signal; and a resynchronization circuit resynchronizing the input data with the second delay synchronization signal to update the first output data to the first synchronization circuit when the first output data is inconsistent with the second output data.

13 Claims, 9 Drawing Sheets

(58) Field of Classification Search
CPC . G06F 1/12; H03K 5/135; H03K 5/14; G11C 7/1093; G11C 7/222; G11C 11/4093
See application file for complete search history.

(56) References Cited

U.S. PATENT DOCUMENTS

| | | | |
|---|---|---|---|
| 8,914,761 | B2 | 12/2014 | Ly et al. |
| 10,237,053 | B2 * | 3/2019 | Uehara ................. H04L 7/0037 |
| 10,637,638 | B2 * | 4/2020 | Lee ........................... H03K 5/14 |

FOREIGN PATENT DOCUMENTS

| KR | 10-2006-0087988 A | 8/2006 |
|---|---|---|
| KR | 10-2011-0010542 A | 2/2011 |
| TW | I453569 B | 9/2014 |

\* cited by examiner

FIG. 9 ations in the case where the synchronization circuit shown in
SYNCHRONIZATION CIRCUIT, SEMICONDUCTOR MEMORY DEVICE, AND SYNCHRONIZATION METHOD FOR SYNCHRONIZING WITH SMALL CIRCUIT SCALE

CROSS REFERENCE TO RELATED APPLICATIONS

This Application claims priority of Japanese Patent Application No. 2021-165180, filed on Oct. 7, 2021, the entirety of which is incorporated by reference herein.

BACKGROUND OF THE INVENTION

Field of the Invention

The disclosure is generally related to a synchronization circuit, a semiconductor memory device and a synchronization method.

Description of the Related Art

In the logic design of the CMOS circuit, the power supply maintains the voltage VDD and the voltage VSS. However, if the input data to the flip-flop circuit does not maintain a sufficient setup margin/hold margin relative to the clock, the output signal of the flip-flop circuit may enter a metastable state. That is, if the timing of the input data is close to the timing of the input clock, and the setup margin or the hold margin is not maintained, the voltage of the output data becomes an intermediate voltage, instead of the voltage VDD or the voltage VSS.

In this case, some logic circuits that receive a signal that becomes such an intermediate voltage treat the intermediate voltage as voltage VDD, and some others that receive a signal that becomes such an intermediate voltage treat the intermediate voltage as the voltage VSS. In addition, the system can be destroyed by this metastable state.

When transmitting and receiving data among different clock domains, a synchronization circuit may be used, but such a metastable state problem may occur in the synchronization circuit. Therefore, in order to suppress the occurrence of a metastable state when transmitting and receiving data among different clock domains, a synchronization circuit using a data strobe signal that synchronizes with the data is known (for example, a patent: JP 10-135938).

Such a synchronization circuit requires an additional circuit related to the data strobe signal. Since the circuit scale is large, a synchronization circuit, a semiconductor memory device, and a synchronization method capable of synchronizing with the clock on the receiving side of the input data with a small circuit scale are required.

BRIEF SUMMARY OF THE INVENTION

The invention provides a synchronization circuit, which comprises a first delay circuit delaying an input synchronization signal by a first predetermined time to generate a first delay synchronization signal; a second delay circuit delaying the first delay synchronization signal by a second predetermined time to generate a second delay synchronization signal; a first synchronization circuit outputting a first output data generated by synchronizing the input data with the input synchronization signal; a second synchronization circuit outputting second output data generated by synchronizing the input data with the first delay synchronization signal; and a resynchronization circuit resynchronizing the input data with the second delay synchronization signal to update the first output data to the first synchronization circuit when the first output data is inconsistent with the second output data.

The invention provides a synchronization method which comprises comparing first data generated by synchronizing input data with a synchronization signal to second data generated by synchronizing the input data with a delayed synchronization signal that is generated by delaying the synchronization signal; and when the first data is inconsistent with the second data, data generated by synchronizing the input data with a more-delayed synchronization signal that is generated by delaying the delayed synchronization signal is output, and the first data is output otherwise.

The invention provides a synchronization method comprises: comparing each bit of first data generated by synchronizing input data including a plurality of bits with a synchronization signal to each bit of second data generated by synchronizing the input data with a signal delaying the synchronization signal; when at least one bit of the first data is inconsistent with the corresponding bit of the second data, outputting the data generated by synchronizing the input data with the more-delayed synchronization signal, and the first data is output otherwise.

As stated above, it is possible to realize a synchronization circuit, a semiconductor memory device, and a synchronization method that can perform synchronization with a small circuit scale.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
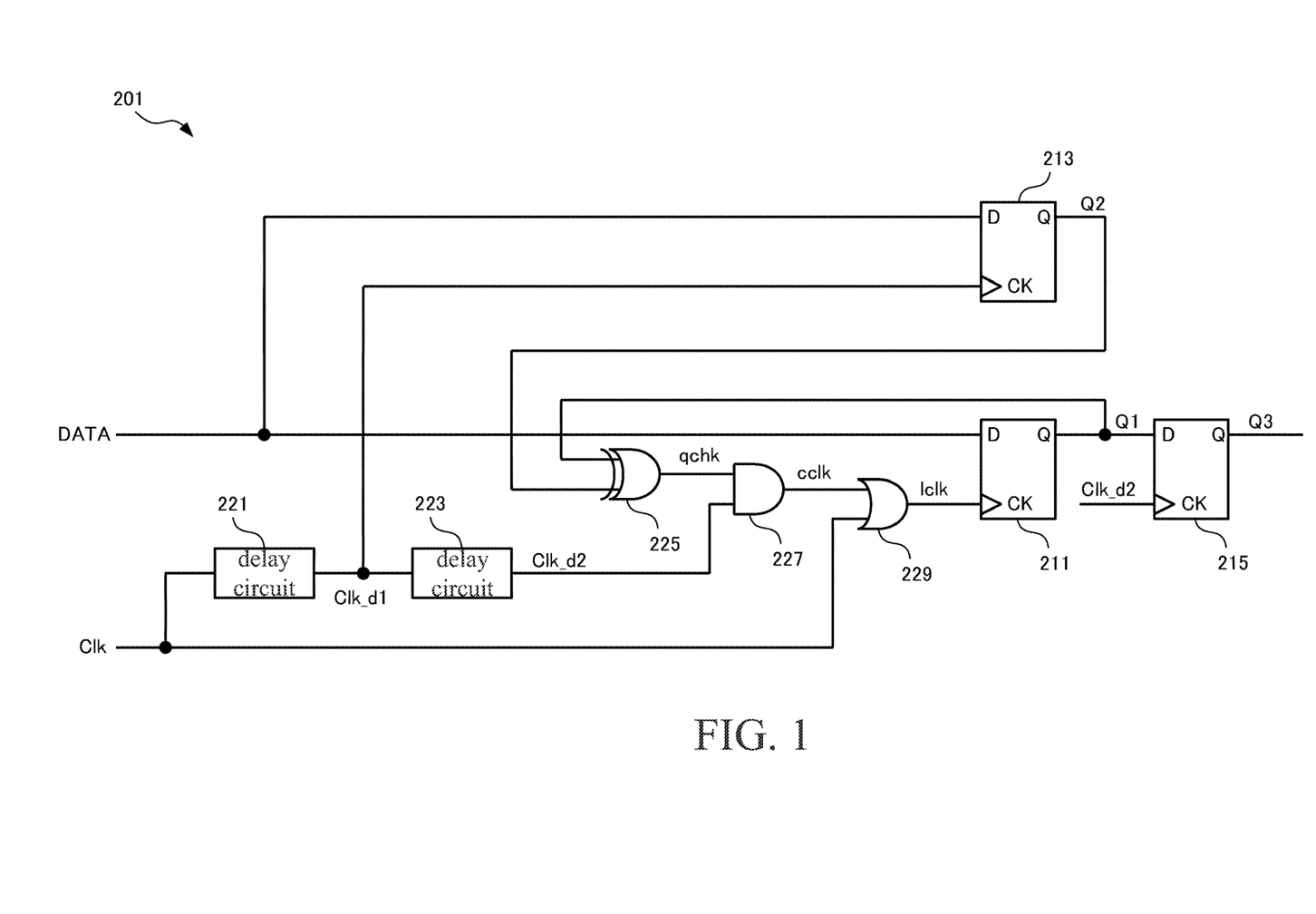
FIG. 1 is a circuit diagram of a synchronization circuit in accordance with a first embodiment of the invention.

The synchronization circuit 201 according to the first embodiment shown in FIG. 1 synchronizes the input data DATA with the input clock Clk and outputs the output data Q3. The synchronization circuit 201 may also be provided in a semiconductor device. The semiconductor device may be a semiconductor memory device such as a dynamic random access memory. In addition, when the synchronization circuit 201 is provided in the dynamic random access memory, the synchronization circuit 201 may handle data related to the temperature referred to when adjusting the refresh interval of the memory cell.

The input data DATA is synchronized with, for example, the clock of the first series, and the clock Clk is synchronized with the clock of the second series. Therefore, the synchronization circuit 201 can transfer the data from the clock of the first series to the clock of the second series.

The synchronization circuit 201 includes: a first D-type flip-flop circuit 211; a second D-type flip-flop circuit 213; and a third D-type flip-flop circuit 215. Here, the first D-type flip-flop circuit 211, the second D-type flip-flop circuit 213, and the third D-type flip-flop circuit 215 are the first synchronization circuit, the second synchronization circuit, and the third synchronization circuit as an example of the invention, respectively. In addition, the synchronization circuit 201 includes: two delay circuits 221, 223; a two-input logic exclusive-OR gate 225; a two-input logical AND gate 227; and a two-input logical OR gate 229.

The input terminal D of the first D-type flip-flop circuit 211 and the input terminal D of the second D-type flip-flop circuit 213 are supplied with 1-bit input data DATA. The output data Q1 from the output terminal Q of the first D-type flip-flop circuit 211 is supplied to the input terminal D of the third-type flip-flop circuit 215.

The delay circuit 221 delays the input clock Clk by the first predetermined delay time, and outputs the delayed input clock Clk as the first delay clock Clk_d1. Further, the delay circuit 223 delays the first delay clock Clk_d1 by a second predetermined delay time to output the second delay clock Clk_d2. The delay circuit 221 and the delay circuit 223 herein are examples of the first delay circuit and the second delay circuit of the invention, respectively. The input clock Clk, the first delayed clock Clk_d1, and the second delayed clock Clk_d2 herein are examples of the first synchronization signal, the second synchronization signal, and the third synchronization signal, respectively.

The two-input logic exclusive-OR gate 225 performs the exclusive-OR operation on the output data Q1 from the output terminal Q of the first D-type flip-flop circuit 211 and the output data Q2 from the output terminal Q of the second D-type flip-flop circuit 213 to output the control signal qchk indicating the result. Therefore, if the logic level of the output data Q1 from the output terminal Q of the first D-type flip-flop circuit 211 and the output data Q2 from the output terminal Q of the second D-type flip-flop circuit 213 are matched, the logic level of the control signal qchk is LOW. If else, the logic level of the control signal qchk becomes HIGH.

The two-input logic AND gate 227 performs the logical AND operation on the control signal qchk and the second delay clock Clk_d2, and outputs the result as the adaptive second delay clock cclk. Therefore, if the logic level of the control signal qchk is HIGH, the adaptive second delay clock cclk corresponding to the second delay clock Clk_d2 is generated. However, if the logic level of the control signal qchk is LOW, the adaptive second delay clock cclk corresponding second delay clock Clk_d2 is not generated.

The two-input logical OR gate 229 performs the logical OR operation on the input clock Clk and the adaptive second delay clock cclk, and outputs the result as the main clock lclk.

The main clock lclk output from the two-input logical OR gate 229 is supplied to the clock terminal CK of the first D-type flip-flop circuit 211. The first delay clock Clk_d1 from the first delay circuit 221 is supplied to the clock terminal CK of the second D-type flip-flop circuit 213. The second delay clock Clk_d2 from the second delay circuit 223 is supplied to the clock terminal CK of the third D-type flip-flop circuit 215.

The first D type flip-flop circuit 211 outputs the output data Q1 from the output terminal Q in which the input data DATA supplied to the input terminal D is synchronized with the rising edge of the main clock lclk supplied to the clock terminal CK from the LOW to the HIGH. The second D type flip-flop circuit 213 synchronizes the input data DATA supplied to the input terminal D with the rising edge of the first delay clock Clk_d1 supplied to the clock terminal CK from LOW to HIGH to output the output data Q2 from the output terminal Q. The third D-type flip-flop circuit 215 outputs the output data Q3 from the output terminal Q. The output data Q3 is result that the output data Q1 supplied to the input terminal D synchronizes with the second delayed clock Clk_d2 supplied to the clock terminal CK rising from LOW to HIGH.

First, the input data DATA and the main clock lclk are synchronized in the first D-type flip-flop circuit 211. The main clock lclk is obtained by slightly delaying the input clock Clk by the two-input logical OR gate 229. The input data DATA synchronized with the main clock lclk is output from the output terminal Q of the first D-type flip-flop circuit 211 as the output data Q1. Next, the input data DATA is synchronized with the first delay clock Clk_d1 in the second D-type flip-flop circuit 213, and the first delay clock Clk_d1 is obtained by delaying the input clock Clk through the delay circuit 221. The input data DATA synchronized with the first delay clock Clk_d1 is output from the output terminal Q of the second D-type flip-flop circuit 213 as the output data Q2.

When the timing of the logic level of the input data DATA changing is similar to the timing of the input clock Clk rising from LOW to HIGH (i.e., the setup margin/hold margin required for the input data DATA relative to the input clock Clk is not guaranteed), there is a possibility that a metastable state occurs in the output data Q1 of the first D-type flip-flop circuit 211. When the timing of the logic level of the input data DATA changing is close to the timing of the rise of the first delay clock Clk_d1 (meaning that the setup margin/hold margin required for the input data DATA relative to the first delay clock Clk_d1 is not guaranteed), there is a possibility that a metastable state occurs in the output data Q2 of the second D-type flip-flop circuit 213.

When the input data DATA maintains the same logic level, in the first D-type flip-flop circuit 211, the input data DATA is synchronized according to the rise of the main clock lclk corresponding to the rise of the input clock Clk. Next, in the second D-type flip-flop circuit 213, if the input data DATA is synchronized by the first delay clock Clk_d1, the input data DATA is synchronized by the first delay clock Clk_d1 in the second D-type flip-flop circuit 213, and then the logic level of the control signal qchk output from the two-input logic exclusive-OR gate 225 is LOW. Therefore, when the second delay clock Clk_d2 rises, the logic level of the adaptive second delay clock cclk supplied from the output terminal of the two-input logic AND gate 227 to the two-input logic OR gate 229 remains LOW, the logic level of the main clock lclk also remains LOW, and the input data DATA is not resynchronized in the first D-type flip-flop circuit 211. Therefore, the logic level of the output data Q1 of the first D-type flip-flop circuit 211 that is synchronously updated by the rising of the main clock lclk corresponding to the rising of the input clock Clk is maintained.

On the other hand, when the logic level of the input data DATA is in a certain logic level (HIGH or LOW), in the first D-type flip-flop circuit 211, the input data DATA is synchronized by the rising of the main clock lclk corresponding to the rising of the input clock Clk. Then, since the logic level of the input data DATA changes to the other logic level (LOW or HIGH), when the input data DATA is synchronized by the first delay clock Clk_d1 in the second D-type flip-flop circuit 213, the logic level of the control signal qchk output from the two-input logic exclusive-OR gate 225 is HIGH.

Therefore, even if the output data Q1 of the first D-type flip-flop circuit 211 or the output data Q2 of the second D-type flip-flop circuit 213 is in a metastable state, when the second delay clock Clk_d2 rises, the logic level of the control signal qchk remains HIGH, and the adaptive second delay clock cclk output from the two-input logic AND gate 227 rises as well. Since the adaptive second delay clock cclk inputs to one of the input terminals of the two-input logic OR gate 229 and the logic level of the other input terminal remains LOW, the two-input logic AND gate 227 and the two-input logic OR gate 229 delays the second delay clock Clk_d2 for a delay time to generate the main clock lclk output from the two-input logical OR gate 229, and then the main clock lclk rises. Therefore, the main clock lclk corresponds to the rise of the second delayed clock Clk_d2, and the input data DATA is resynchronized in the first D-type flip-flop circuit 211 according to the rise of the main clock lclk.

The logic level of the output data Q1 of the first D-type flip-flop circuit 211 synchronously updated according to the rise of the main clock lclk corresponding to the rise of the input clock Clk is updated according to the rise of the main clock lclk corresponding to the rise of the second delay clock Clk_d2. In addition, in this embodiment, the two-input logic exclusive-OR gate 225, the two-input logic AND gate 227, the two-input logic OR gate 229, and the first D-type flip-flop circuit 211 are an example of the resynchronization circuit of the invention.

Figure 2:
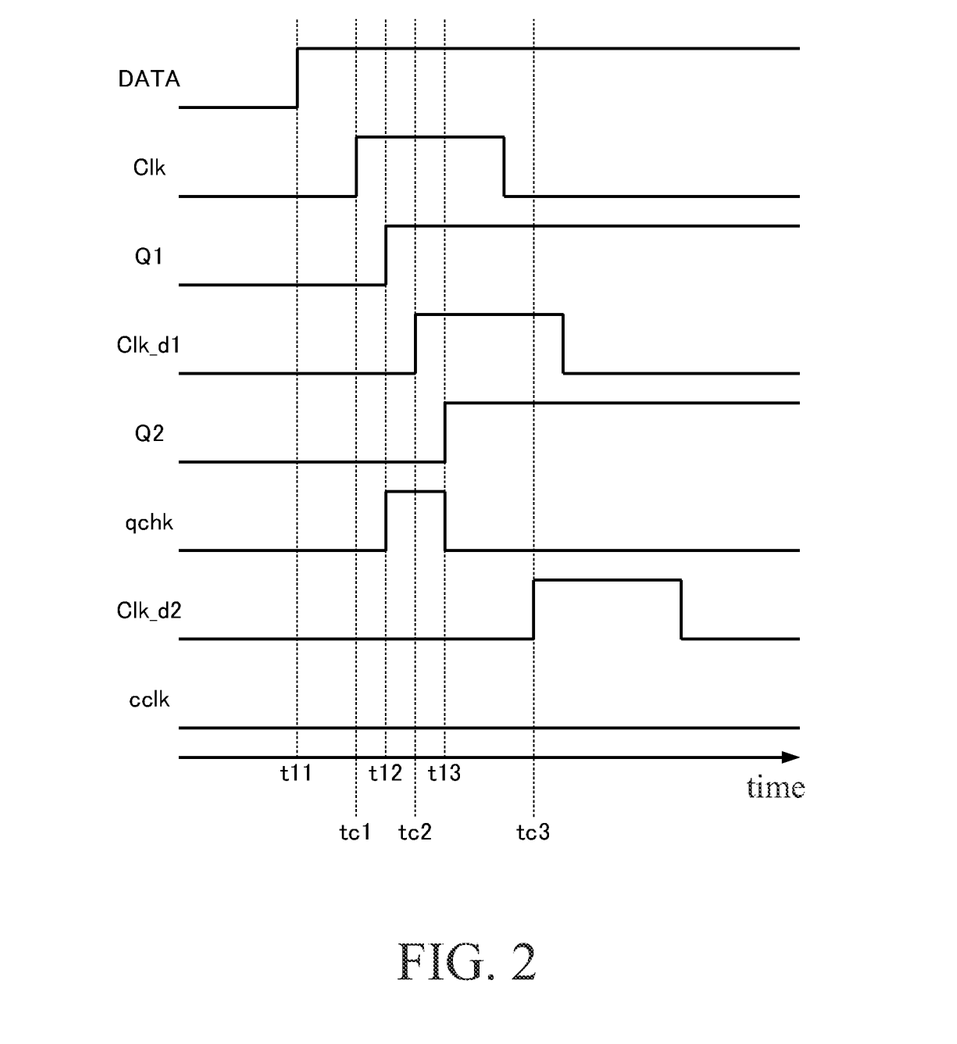
FIG. 2 is a timing chart illustrating an example of operations in the case where the synchronization circuit shown in FIG. 1 does not perform resynchronization.

An example of the case where the input data DATA is not resynchronized in the first D-type flip-flop circuit 211 will be described with reference to FIG. 2.

At time t11, the logic level of the input data DATA changes from LOW to HIGH. At time tc1, the input data whose logic level is HIGH are synchronized in the first D-type flip-flop circuit 211 according to the rise of the main clock lclk corresponding to the rise of the input clock Clk. The logic level of the output data Q1 of the first D-type flip-flop circuit 211 becomes HIGH after the time t12 slightly delayed from the time tc1 when the input clock Clk rises. At time tc2, the input data DATA whose logic level is HIGH is synchronized in the second D-type flip-flop circuit 213 according to the rise of the first delay clock Clk_d1. The logic level of the output data Q2 of the second D-type flip-flop circuit 213 becomes HIGH at the time t13 slightly delayed from the time tc2 that the first delay clock Clk_d1 rises.

The logic level of the control signal qchk becomes HIGH from time t12 to time t13, but becomes LOW after time t13. At time tc3 that the second delay clock Clk_d2 rises, since the logic levels of the output data Q1 and Q2 are the same, the logic level of the control signal qchk is LOW, and the adaptive second delay clock cclk is not generated. Therefore, resynchronization in the first D-type flip-flop circuit 211 according to the rise of the main clock lclk corresponding to the rise of the second delayed clock Clk_d2 does not occur. By synchronizing with the rising of the main clock lclk corresponding to the rising of the input clock Clk, the logic level of the output data Q1 of the first D-type flip-flop circuit 211 updated at time t12 is maintained. In the first D-type flip-flop circuit 211, the output data Q1 that is synchronized only once is then synchronized in the third D-type flip-flop circuit 215 at the time that the second delay clock Clk_d2 rises as the output data Q3 output from the output terminal Q of the third D-type flip-flop circuit 215.

Figure 3:
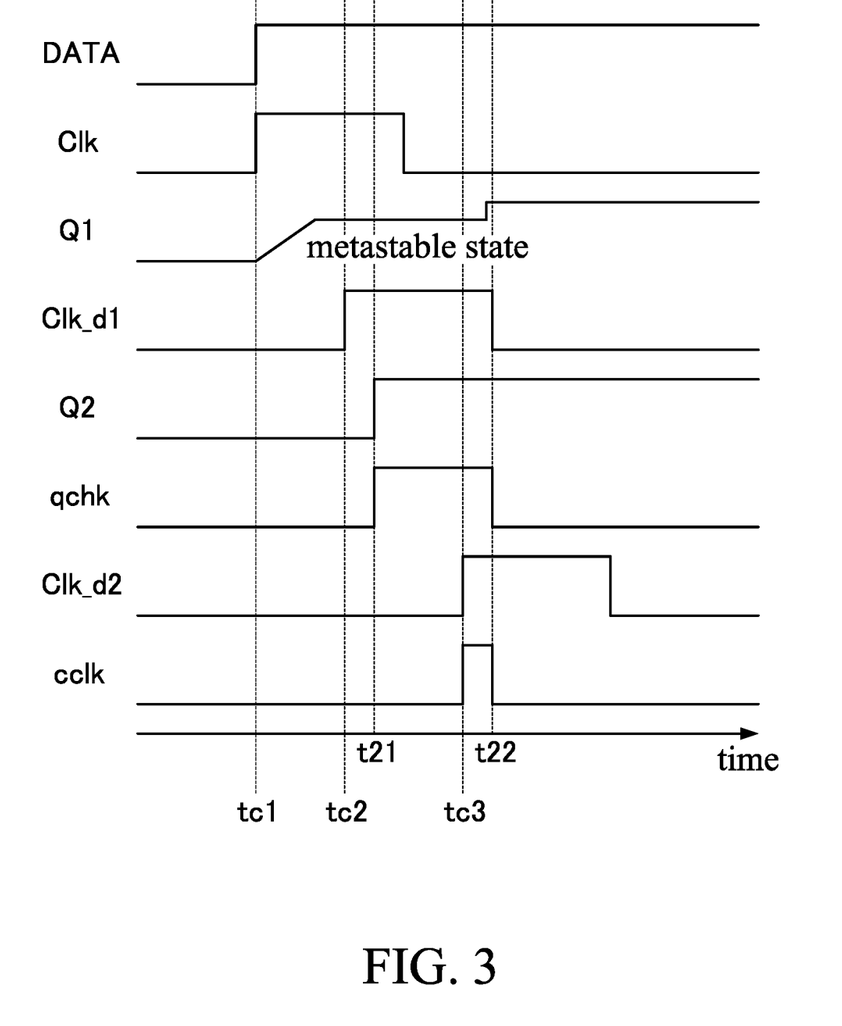
FIG. 3 is a timing chart illustrating a first example of operations in the case where the synchronization circuit shown in FIG. 1 performs resynchronization.

Referring to FIG. 3, it is illustrated that the output data Q1 of the first D-type flip-flop circuit 211 is in a metastable state, so the input data DATA is resynchronized in the D-type flip-flop circuit 211 according to the rise of the main clock lclk corresponding to the rise of the second delay clock Clk_d2.

At time tc1, the input data DATA whose logic level changes from LOW to HIGH is synchronized in the first D-type flip-flop circuit 211 according to the rise of the main clock lclk corresponding to the rise of the input clock Clk. However, since the necessary setup margin/hold margin for the input data DATA of the input clock Clk is not ensured, the output data Q1 of the first D-type flip-flop circuit 211 becomes a metastable state after the time tc1. In addition, by the resynchronization described later, after time t22, the logic level of the output data Q1 of the first D-type flip-flop circuit 211 is stabilized to HIGH. At time tc2, the input data DATA whose logic level is HIGH is synchronized in the second D-type flip-flop circuit 213 according to the rise of the first delay clock Clk_d1. The logic level of the output data Q2 of the second D-type flip-flop circuit 213 becomes HIGH after the time t21 slightly delayed from the time tc2 that the first delay clock Clk_d1 rises.

As described above, the output data Q1 of the first D-type flip-flop circuit 211 is in a metastable state during the period from the time tc1 to the time t22, but, the logic level in the two-input logic exclusive-OR gate 225 is judged as LOW. If the logic levels of the output data Q1 and Q2 are different, the logic level of the control signal qchk output from the two-input logic exclusive-OR gate 225 will become HIGH. Therefore, the logic level of the control signal qchk is HIGH from the time t21.

At the time tc3 that the second delay clock Clk_d2 rises, the logic level of the control signal qchk is HIGH, and the adaptive second delay clock cclk also rises. Although it is not shown in FIG. 3, around the time tc3, the logic level of the input clock Clk is LOW, and the main clock lclk corresponding to the adaptive second delay clock cclk also rises.

Therefore, resynchronization is performed in the first D-type flip-flop circuit 211 according to the rise of the main clock lclk corresponding to the rise of the second delay clock Clk_d2. At the time t22, the logic level of the output data Q1 of the first D-type flip-flop circuit 211 and the logic level of the input data DATA both are updated to HIGH, and the logic level of the control signal qchk becomes LOW. The output data Q1 resynchronized in the first D-type flip-flop circuit 211 is then synchronized in the third D-type flip-flop circuit 215 as the output data Q3 from the third D-type flip-flop circuit 215 when the second delay clock Clk_d2 rises. The output terminal Q of the third D-type flip-flop circuit 215 is output.

Figure 4:
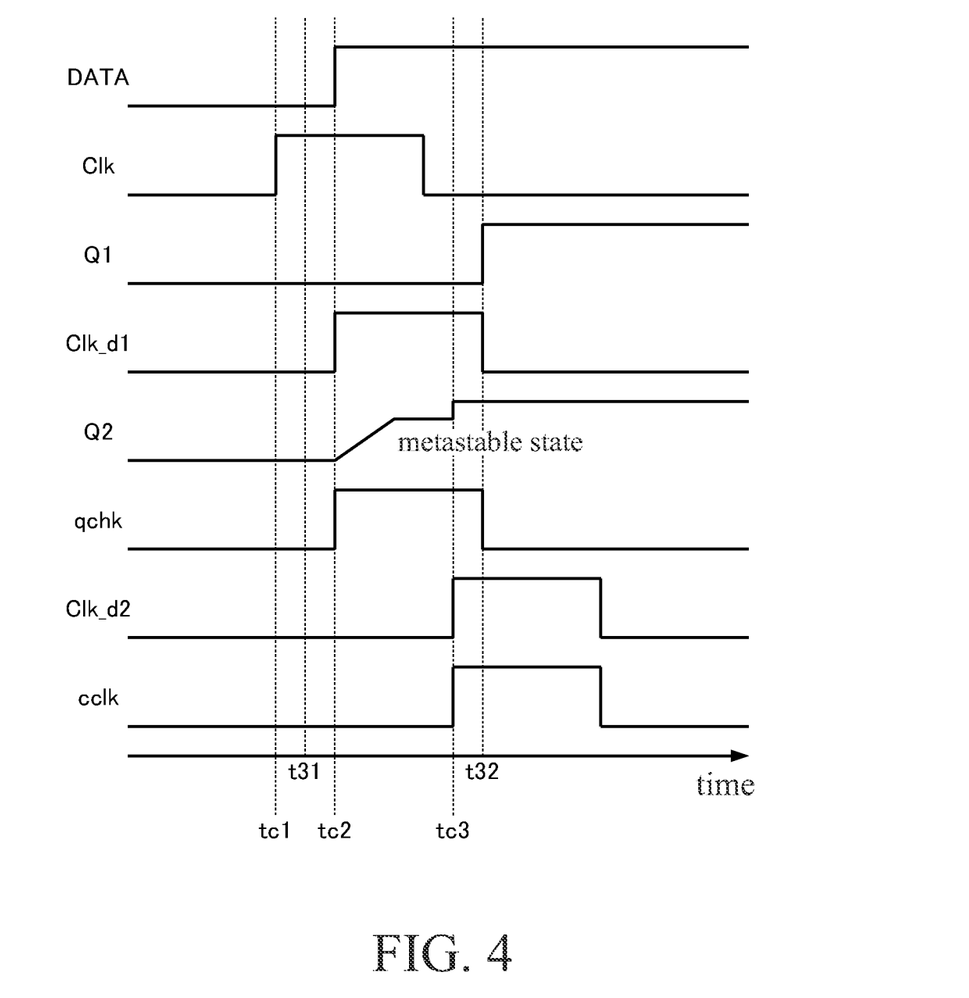
FIG. 4 is a timing chart illustrating a second example of operations in the case where the synchronization circuit shown in FIG. 1 performs resynchronization.

Referring to FIG. 4, it is illustrated that the output data Q2 of the second D-type flip-flop circuit 213 is in a metastable state so the input data DATA is resynchronized in the D-type flip-flop circuit 211 according to the rise of the main clock lclk corresponding to the rise of the second delay clock Clk_d2.

At the time tc1, the input data DATA whose logic level is LOW is synchronized in the first D-type flip-flop circuit 211 according to the rise of the main clock lclk corresponding to the rise of the input clock Clk. The logic level of the output data Q1 of the first D-type flip-flop circuit 211 becomes LOW after the time t31 which is slightly delayed from the time tc1 that the input clock Clk rises. In addition, in the example of FIG. 4, the logic level of the output data Q1 of the first D-type flip-flop circuit 211 is also LOW before time t31. At the time tc2, the input data DATA whose logic level changes from LOW to HIGH is synchronized in the second D-type flip-flop circuit 213 according to the rise of the first delay clock Clk_d1. However, since the required setup margin/hold margin for the input data DATA of the first delayed clock Clk_d1 is not ensured, after the time tc2, the output data Q2 of the second D-type flip-flop circuit 213 becomes a metastable state. In addition, after the time tc3, the logic level of the output data Q2 of the second D-type flip-flop circuit 213 is stabilized to HIGH.

Therefore, during the period from the time tc2 to the time tc3, although the output data Q2 of the second D-type flip-flop circuit 213 is in a metastable state, the logic level of the two-input logic exclusive-OR gate 225 is judged as HIGH. Since the logic levels of the output data Q1 and Q2 are different, the logic level of the control signal qchk output from the two-input logic exclusive-OR gate 225 is HIGH after the time tc2. At the time tc3 corresponding to the rising of the second delay clock Clk_d2, the logic level of the control signal qchk is HIGH, and the adaptive second delay clock cclk also rises. Although it is not shown in the FIG. 4, around the time tc3, the logic level of the input clock Clk is LOW, and the main clock lclk corresponding to the rise of the adaptive second delay clock cclk also rises.

Therefore, according to the rise of the main clock lclk corresponding to the rise of the second delay clock Clk_d2, resynchronization is performed in the first D-type flip-flop circuit 211. At the time t32, the logic level of the output data Q1 of the first D-type flip-flop circuit 211 and the logic level of the input data DATA are both updated to be HIGH. The output data Q1 resynchronized in the first D-type flip-flop circuit 211 is then synchronized in the third D-type flip-flop circuit 215 as the output data Q3 from the third D-type flip-flop circuit 215 when the second delay clock Clk_d2 rises.

In addition, if a sum of the first predetermined delay time through the delay circuit 221 and the second predetermined delay time through the delay circuit 223 is less than the period for which the input data DATA holds in the same logic level (for example: the clock period of the input data DATA), the output data Q3 can be stably output from the synchronization circuit 201. Even if the output data Q1 changes to a metastable state through the initial synchronization, the stable output data Q1 can be obtained by resynchronization.

Figure 5:
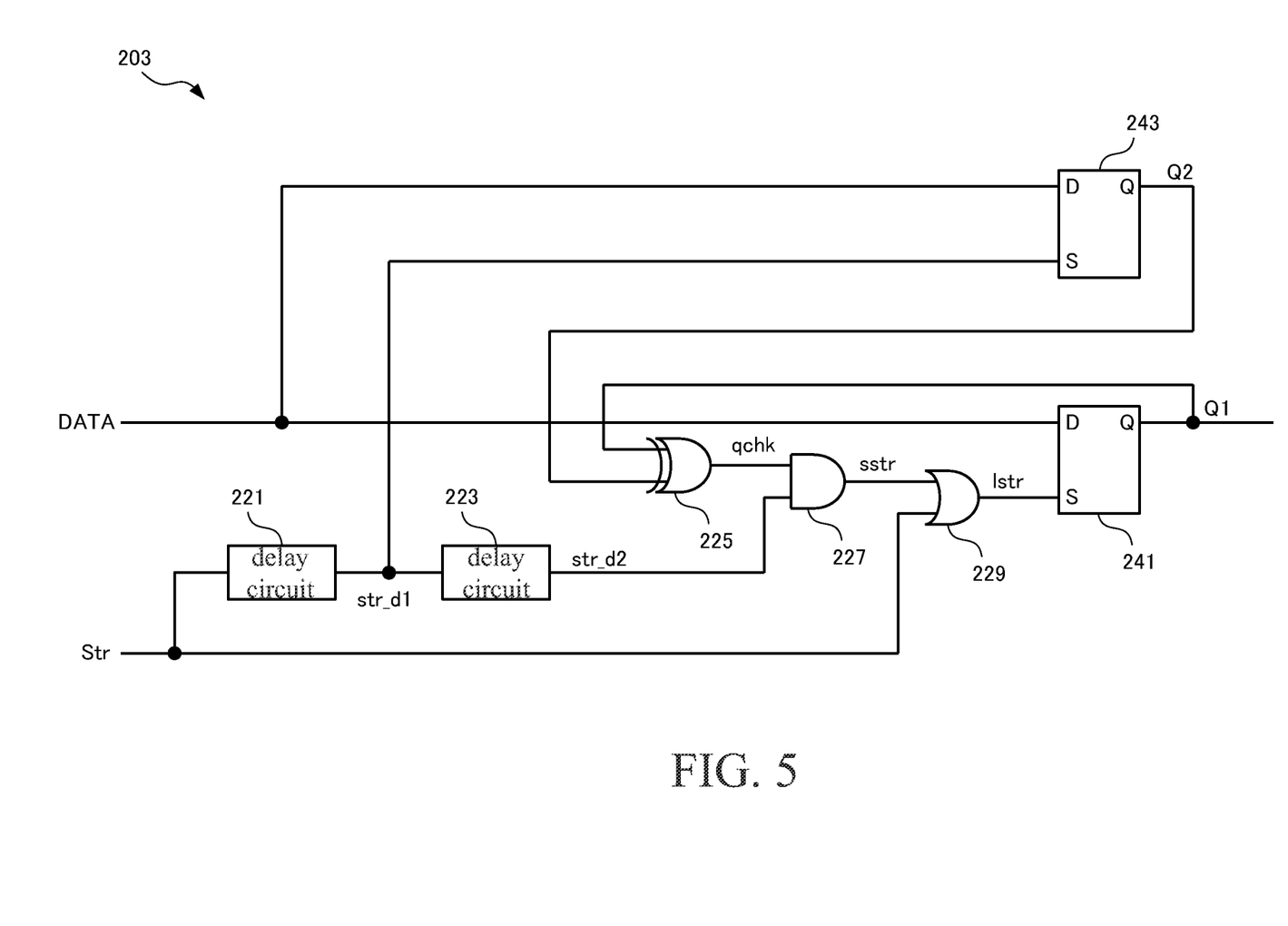
FIG. 5 is a circuit diagram of a synchronization circuit in accordance with a second embodiment of the invention.

FIG. 5 illustrates the synchronization circuit 203 based on the second embodiment. When comparing the synchronization circuit 203 with the synchronization circuit 201 based on the first embodiment, there are some difference as following: the first D-type flip-flop circuit 211 and the second D-type flip-flop circuit 213 are respectively replaced with the first latch circuit 241 and the second latch circuit 243; the third D-type flip-flop circuit 215 is omitted.

In addition, referring to FIG. 1 and FIG. 5, when the synchronization circuit 203 is compared with the synchronization circuit 201 based on the first embodiment, there are some differences as follows: the input clock Clk, the first delay clock Clk_d1, and the second delay clock Clk_d2 are replaced with the input strobe signal Str, the first delay strobe signal str_d1, and the second delay strobe signal str_d2 respectively. The input strobe signal Str, the first delayed strobe signal str_d1, and the second delayed strobe signal str_d2 are respectively another embodiments of the first synchronization signal, the second synchronization signal, and the third synchronization signal of the invention. Furthermore, the adaptive second delay clock cclk and the main clock lclk are respectively replaced with the adaptive second delay strobe signal sstr and the main strobe signal 1str.

Figure 9:
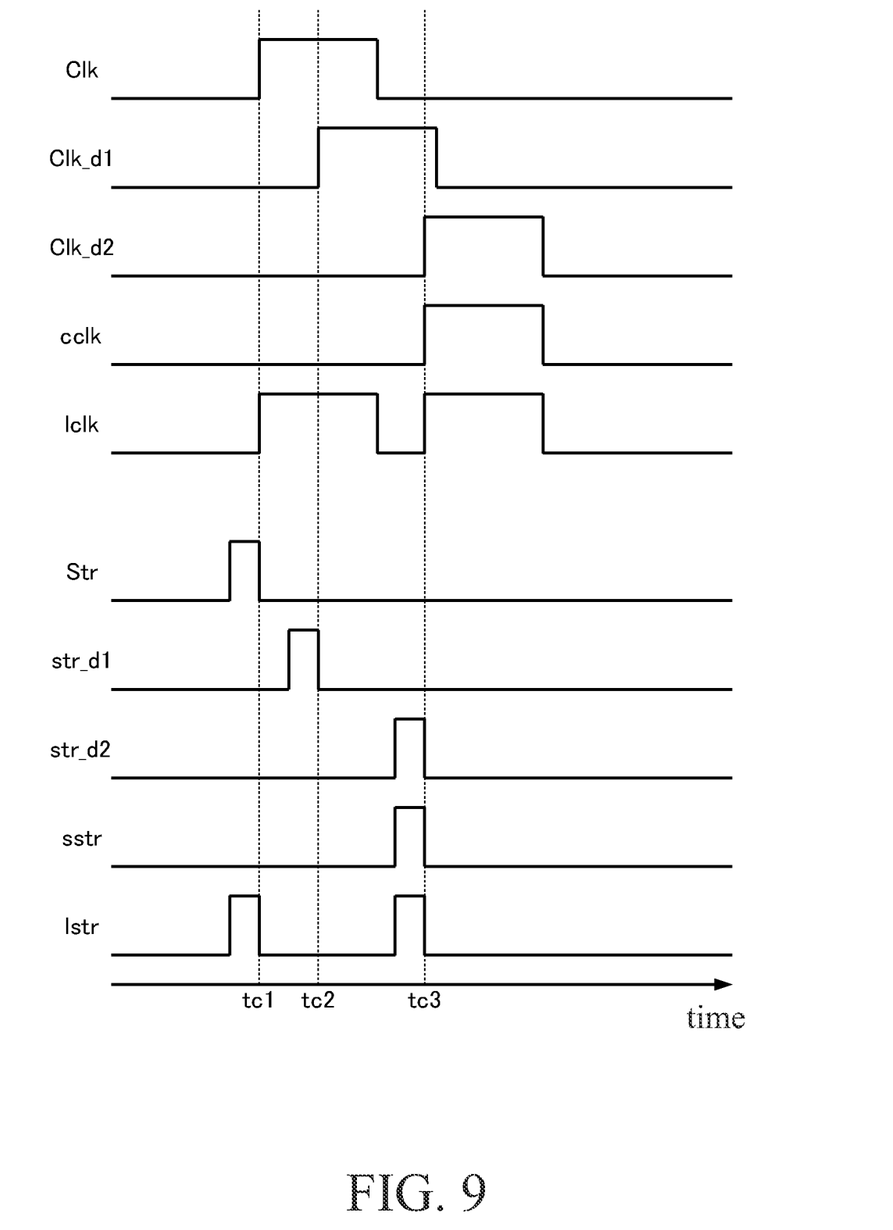
FIG. 9 is a timing chart illustrating the correspondence between the clock in the synchronization circuit based on the first embodiment and the data strobe signal in the synchronization circuit based on the second embodiment in FIG. 5.

As shown in FIG. 9, at the rising time tc1 of the input clock Clk, the input strobe signal Str falls. At the rising time tc2 of the first delay clock Clk_d1, the first delay strobe signal str_d1 falls. At the rising time tc3 of the second delay clock Clk_d2, the second delay strobe signal str_d2 falls.

In addition, the adaptive second delay strobe signal sstr, like the adaptive second delay clock cclk, is generated when the logic level of the control signal qchk is HIGH, and not generated otherwise. When the adaptive second delay strobe signal sstr is generated, the adaptive second delay strobe signal sstr falls at the same time as the rise time of the adaptive second delay clock cclk. The main strobe signal lstr for the first synchronization falls at the same timing as the rise of the main clock lclk for the first synchronization. In addition, the main strobe signal lstr for resynchronization falls at the same timing as the rise time of the main clock lclk for resynchronization.

Generally speaking, a D-type flip-flop circuit is configured to output data by synchronizing the input data with the rising of the input clock. On the contrary, the latch circuit maintains the input data as output data while the logic level of the strobe signal is HIGH, and maintains the output data having the logic level of the input data when the strobe signal falls. Therefore, the first latch circuit 241 and the second latch circuit 243 based on the second embodiment operate as the first D-type flip-flop circuit 211 and the second D-type flip-flop circuit 213 based on the first embodiment. Since the D-type flip-flop circuit is replaced with a latch circuit, the circuit scale can be reduced.

In the second embodiment, there is no third latch circuit corresponding to the third D-type flip-flop circuit 215 in the first embodiment. However, a third latch circuit corresponding to the third D-type flip-flop circuit 215 may also be provided.

In a dynamic random access memory, a refresh circuit is provided for recharging the memory cells that gradually reduce the accumulated charge. In the update circuit, there are cases where the temperature data for update rate control is composed of a plurality of bits. The temperature data composed of a plurality of bits is utilized as the input data to the synchronization circuit, and the need for clock conversion occurs. The synchronization circuit based on the first embodiment and the synchronization circuit based on the second embodiment process input data consisting of only 1 bit. However, for example, if only a plurality of synchronization circuits for processing only 1 bit are arranged in parallel, the operation of the synchronization circuits will be different among one another, and the clock conversion cannot be performed correctly. That is, although resynchronization occurs in some synchronization circuits corresponding to some bits, resynchronization does not occur in the synchronization circuits corresponding to other bits. Therefore, clock conversion cannot be performed correctly. The synchronization circuit based on the third embodiment is provided to deal with this issue.

Figure 6:
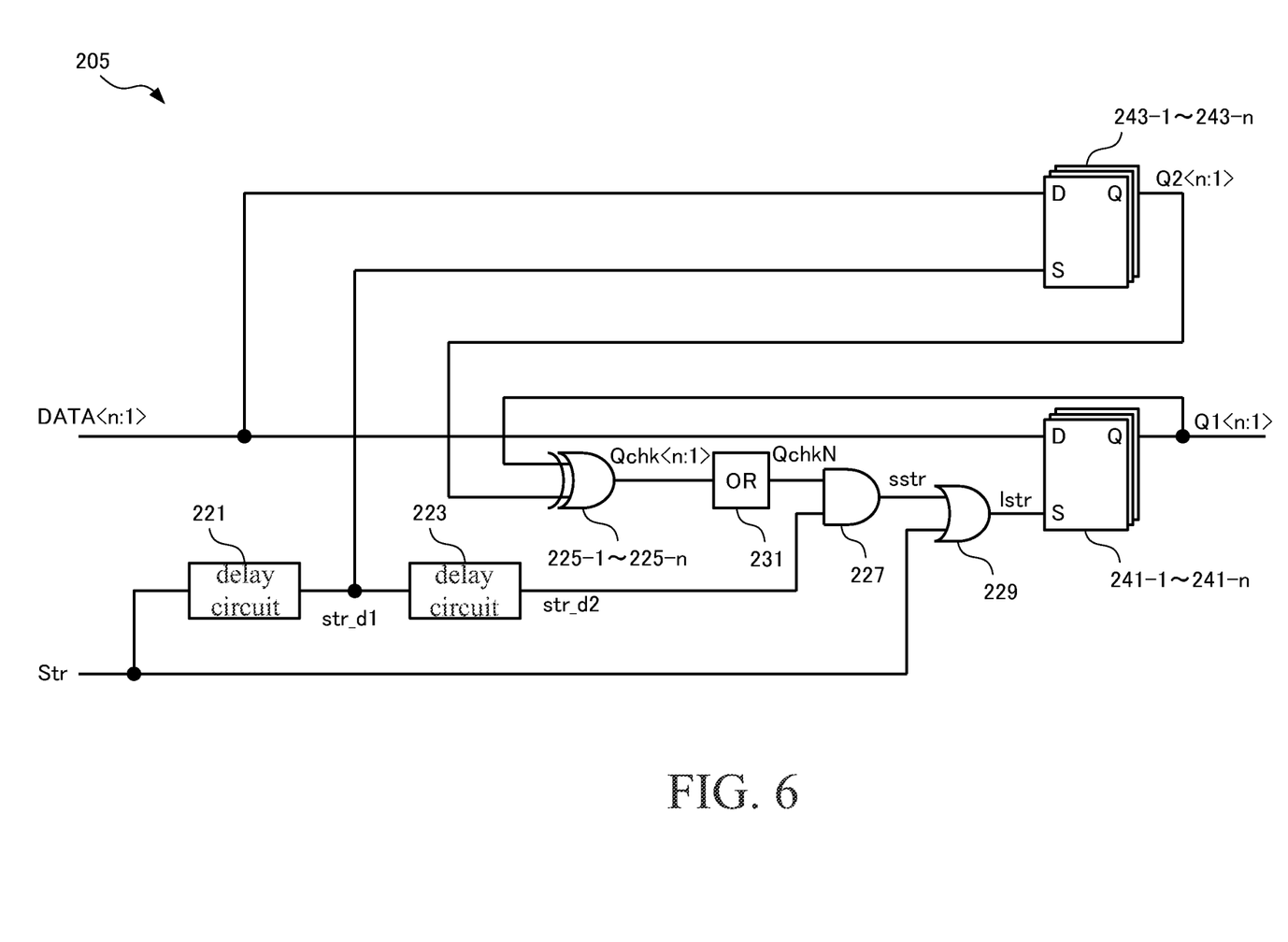
FIG. 6 is a circuit diagram of a synchronization circuit in accordance with a third embodiment of the invention.

FIG. 6 illustrates the synchronization circuit 205 based on the third embodiment. In the synchronization circuit 203 based on the second embodiment, the number of bits of the input data DATA is 1. In the synchronization circuit 205 based on the third embodiment, the number of bits of the input data DATA is a plural n (n is an integer not less than 2).

When comparing the synchronization circuit 205 based on the third embodiment with the synchronization circuit 203 based on the second embodiment, there are some differences as follows: the first latch circuit 241, the second latch circuit 243, and the two-input logic exclusive-OR gate 225 are respectively replaced with a plurality of (n as illustrated herein) first latch circuits 241-1~241-n and a plurality of (n as illustrated herein) second latch circuits 243-1~243-n and a plurality of (n as illustrated herein) two-input logic exclusive-OR gates 225-1~225-n; and the additional n-input logic OR gate 231.

The plurality of first latch circuits 241-1~241-n latch the n-bit input data DATA<n:1> by the main strobe signal lstr to output the n-bit output data Q1<n:1>. The plurality of second latch circuits 243-1~243-n latch the n-bit input data DATA<n:1> by the first delay strobe signal str_d1 to output the n-bit output data Q2<n:1>. The i-th two-input logic exclusive-OR gate 225-i (i=1, 2, . . . , n) among a plurality of two-input logic exclusive-OR gates 225-1~225-n performs the logic exclusive-OR operation on the i-th bit of the output data Q1<n:1> and the i-th bit of the output data Q2<n:1>, and the result is output as the i-th bit of the preparatory control signal Qchk<n:1>. The n-input logic OR gate 231 performs the logical OR operation on the preliminary control signal Qchk<n:1>, and supplies the control signal QchkN displaying the result from the output terminal to one of the input terminals of the two-input logic AND gate 227. The two-input logic AND gate 227 and the two-input logic OR gate 229 are the same as those of the second embodiment.

Next, a plurality of two-input logic exclusive-OR gates 225-1~225-n compare each bit of the output data Q1<n:1> and the output data Q2<n:1>. If a plurality of two-input logic exclusive-OR gates 225-1~225-n output the preparatory control signal Qchk<n:1> for indicating that at least one bit of the output data Q1<n:1> and the output data Q2<n:1> is at different, when the main strobe signal lstr corresponding to the fall of the adaptive second delay strobe signal sstr falls, the input data DATA<n:1> is latched in the plurality of first latch circuits 241-1~241-n again.

An example of a case where the n-bit input data DATA<n:1> is not re-latched in the plurality of first latch circuits 241-1~241-n will be described with reference to FIG. 7.

When the main strobe signal lstr falls corresponding to the falling of the input strobe signal Str, the n-bit input data DATA<n:1> is latched in the plurality of first latch circuits 241-1~241-n. Therefore, the output data Q1<n:1> of the plurality of first latch circuits 241-1~241-n change at a time t41 slightly delayed from the time tc1 that the input strobe signal Str falls.

When the first delayed strobe signal str_d1 falls, the n-bit input data DATA<n:1> is latched in the second latch circuits 243-1~243-n. Therefore, the output data Q2<n:1> of the plurality of second latch circuits 243-1~243-n change at a time t42 slightly delayed from the time tc2 that the first delayed strobe signal str_d1 falls.

During the period from the time t41 to the time t42, the logic levels of at least part of the bits of the output data Q2<n:1> of the plurality of second latch circuits 243-1~243-n change to be inconsistent with the corresponding bits of the output data Q1<n:1> of the plurality of first latch circuits 241-1~241-n are. Therefore, at least one logic level of the preparatory control signal Qchk<n:1> output by the plurality of two-input logic exclusive-OR gates 225-1~225-n becomes HIGH, and the logic level of the control signal QchkN output by the n-input logical OR gate 231 becomes HIGH.

After the time t42, the logic levels of the output data Q2<n:1> of the plurality of second latch circuits 243-1~243-n and the logic level of the output data Q1<n:1> of the plurality of first latch circuits 241-1~241-n are identical correspondingly. Therefore, the logic levels of all the preparatory control signals Qchk<n:1> output by the plurality of two-input logic exclusive-OR gates 225-1~225-n become LOW, and the logic level of the control signal QchkN output by the n-input logic OR gate 231 becomes LOW.

At the time tc3 when the second delayed strobe signal str_d2 falls, the logic level of the control signal QchkN becomes LOW. Therefore, the adaptive second delay strobe signal sstr and the main strobe signal lstr do not fall, and re-latching in the plurality of first latch circuits 241-1~241-n do not occur. The logic levels of the latched output data Q1<n:1> of the plurality of first latch circuits 241-1~241-n are not updated by re-latching and are remained as they are.

In addition, even if the n-bit input data DATA<n:1> is changed during the period of the length tTRAN from the time tc3 to the time t43, the logic levels of the output data Q1<n:1> of the plurality of first latch circuits 241-1~241-n remain as they are. The n-bit input data DATA<n:1> varies with the offset among the bits during a period from time tc3 to time t43.

Figure 8:
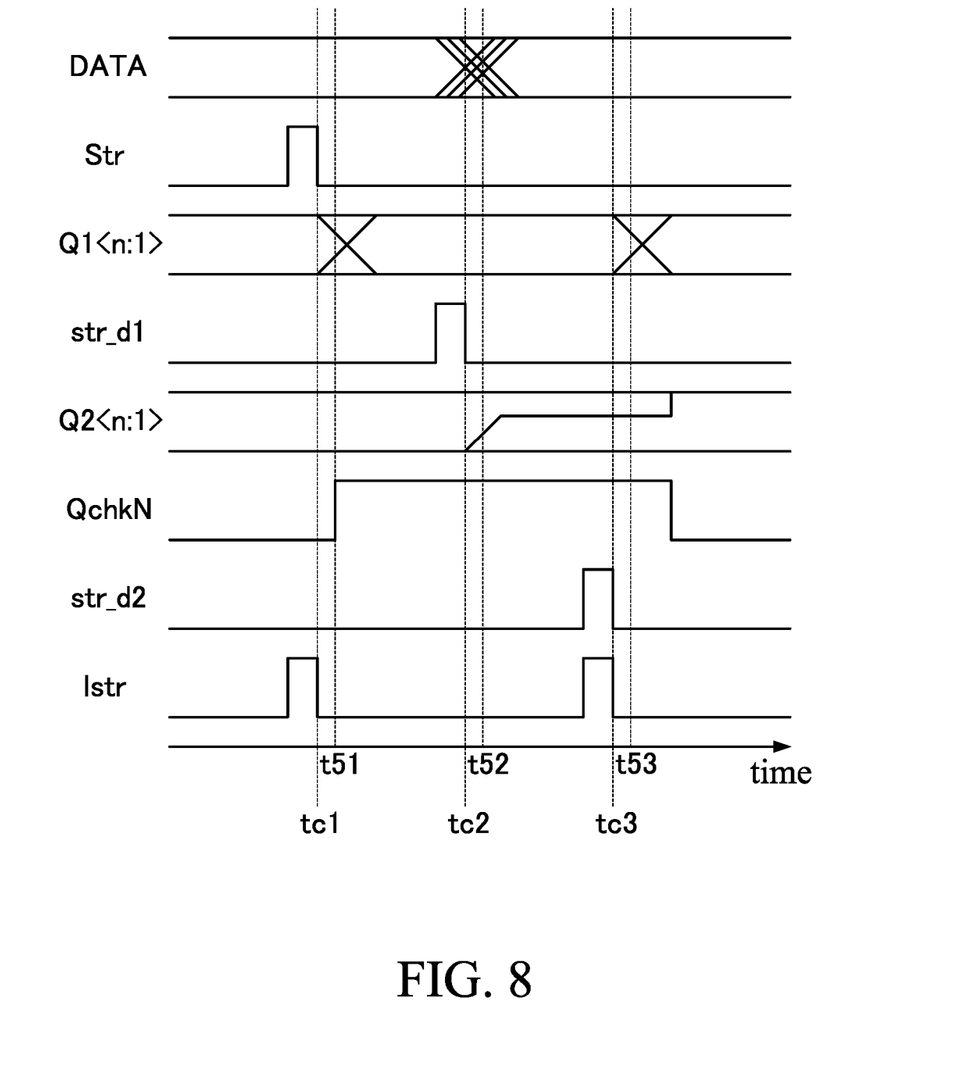
FIG. 8 is a timing chart illustrating an example of operations in the case where the synchronization circuit shown in FIG. 6 performs resynchronization.

Referring to the example of FIG. 8, it is illustrated that when the main strobe signal lstr falls corresponding to the fall of the second delayed strobe signal str_d2, the n-bit input data DATA<n:1> is re-latched in the plurality of first latch circuits 241-1~241-n.

The n-bit input data DATA<n:1> is latched in the plurality of first latch circuits 241-1~241-n according to the falling of the main strobe signal lstr corresponding to the falling of the input strobe signal Str. Therefore, the output data Q1<n:1> of the plurality of first latch circuits 241-1~241-n change at the time t51 slightly delayed from the time tc1 that the input signal falls.

Figure 7:
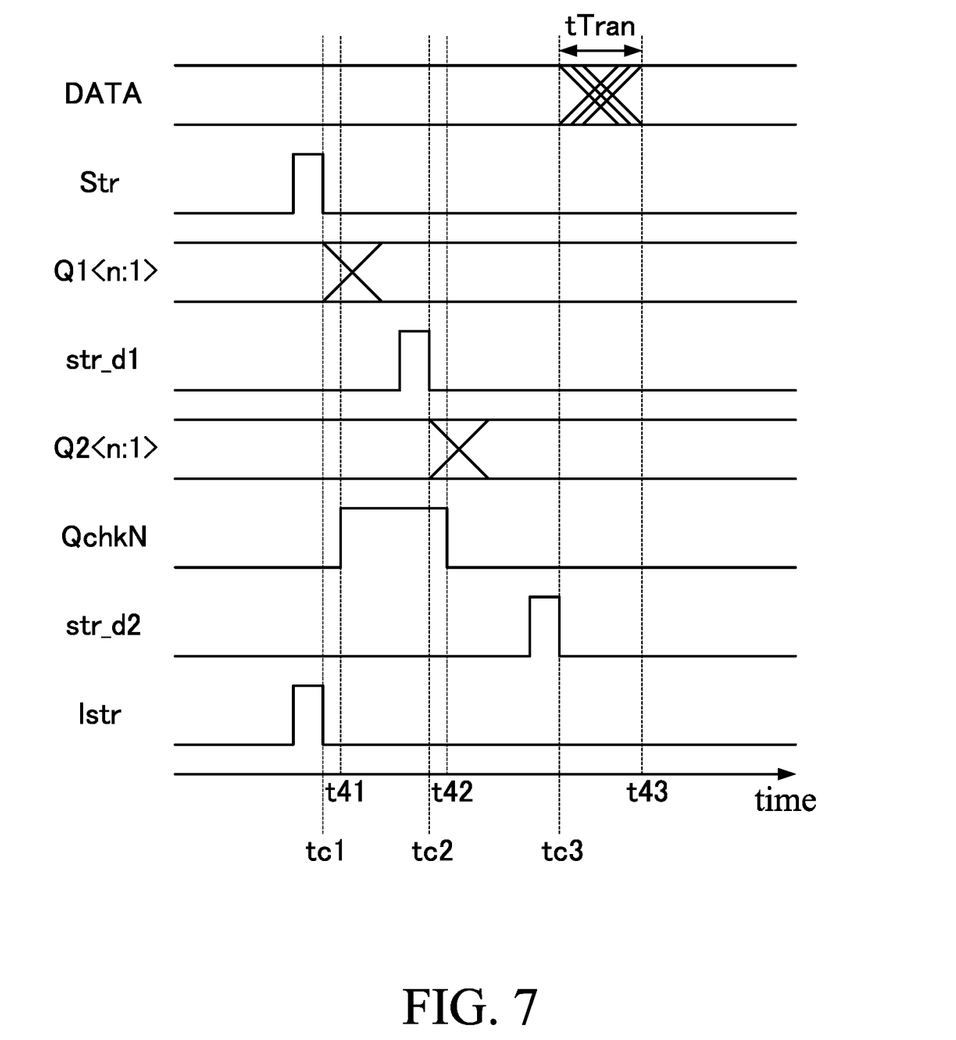
FIG. 7 is a timing chart illustrating an example of operations in the case where the synchronization circuit shown in FIG. 6 does not perform resynchronization.

As in the case of FIG. 7, starting from time t51, the logic levels of the bits of at least a part of the output data Q1<n:1> of the plurality of first latch circuits 241-1~241-n, becomes inconsistent with the corresponding bits of the output data Q2<n:1> of the plurality of second latch circuits 243-1~243-n. Therefore, starting from time t51, at least one logic level of the preparatory control signals Qchk<n:1> output by the plurality of two-input logic exclusive-OR gates 225-1~225-n becomes HIGH, and the logic level of the control signal QchkN output by the n-input logical OR gate 231 becomes HIGH.

Around the time tc2 that the first delayed strobe signal str_d1 falls, the logic level of the n-bit input data DATA<n:1> changes, which is different from the example in FIG. 7. The n-bit input data DATA<n:1> is setup according to the falling of the first delayed strobe signal str_d1 and latched in the plurality of second latch circuits 243-1~243-n.

It is assume that the logic level of each bit of the n-bit input data DATA<n:1> at time tc2 is identical to that of the n-bit input data DATA<n:1> at time tc1. After the time t52 corresponding to the time t42 in FIG. 7, the logic level of the control signal QchkN becomes LOW. In addition, FIG. 8 does not illustrate that the logic level of the control signal QchkN becomes LOW after time t52.

As described above, due to the change of the logic level of the n-bit input data DATA<n:1> around the time tc2, setup margin/hold margin required for the input data DATA is not ensured with respect to the falling of the first delay gate signal str_d1. Therefore, at least part of the bits of the output data Q2<n:1> of the plurality of second latch circuits 243-1~243-n are in a metastable state. Alternatively, the logic levels of at least part of the bits of the output data Q2<n:1> of the plurality of second latch circuits 243-1~243-n and the logic levels of the corresponding bits of the output data Q1<n:1> of the plurality of first latch circuits 241-1~241-n remain inconsistent. Therefore, after time t51, the logic levels of the outputs of the gates included in at least part of the plurality of two-input logic exclusive-OR gates 225-1~225-n whose logic level becomes HIGH are also maintained HIGH after time t52 corresponding to time t42 in FIG. 7. Therefore, as shown in FIG. 8, the logic level of the control signal QchkN remains HIGH after time t52.

At the time tc3 that the second delay strobe signal str_d2 falls, the logic level of the control signal QchkN is HIGH, and the adaptive second delay strobe signal sstr also falls. When the main strobe signal lstr falls corresponding to the fall of the adaptive second delay strobe signal sstr, the input data DATA<n:1> is re-latched in the plurality of first latch circuits 241-1~241-n. Therefore, at time t53, the logic levels of the output data Q1<n:1> of the plurality of first latch circuits 241-1~241-n are updated.

In addition, if a sum of the first predetermined delay time through the delay circuit 221 and the second predetermined delay time through the delay circuit 223 is set to be less than a time of the period for holding the same logic level of the input data DATA (for example: the clock period of the input data DATA) minus the maximum offset time, the output data Q3 can be stably output from the synchronization circuit 205. Even if the output data Q1 becomes a metastable state through the initial synchronization, the stable output data Q1 can be obtained by resynchronization.

What is claimed is:

1. A synchronization circuit comprising:
a first delay circuit, delaying an input synchronization signal by a first predetermined time to generate a first delay synchronization signal;
a second delay circuit, delaying the first delay synchronization signal by a second predetermined time to generate a second delay synchronization signal;
a first synchronization circuit, outputting a first output data, wherein the first output data is generated by synchronizing an input data with the input synchronization signal;
a second synchronization circuit, outputting a second output data, wherein the second output data is generated by synchronizing the input data with the first delay synchronization signal; and
a resynchronization circuit, resynchronizing the input data with the second delay synchronization signal to update the first output data of the first synchronization circuit when the first output data is inconsistent with the second output data.

2. The synchronization circuit as defined in claim 1, further comprising:
a third synchronization circuit, outputting a third output data, wherein the third output data is generated by synchronizing the first output data with the second delay synchronization signal.

3. The synchronization circuit as defined in claim 1, wherein a sum of the first predetermined time and the second predetermined time is less than a minimum hold time of the input data.

4. The synchronization circuit as defined in claim 1, wherein:
the input data, the first output data, and the second output data each comprises a plurality of bits;
when at least one bit of the first output data is inconsistent with the corresponding bit of the second output data, the resynchronization circuit resynchronizes the input data according to the second delay synchronization signal to update the first output data of the first synchronization circuit.

5. The synchronization circuit as defined in claim 1, wherein the first synchronization circuit is a first D-type flip-flop circuit, and the second synchronization circuit is a second D-type flip-flop circuit.

6. The synchronization circuit as defined in claim 5, wherein the resynchronization circuit comprises a two-input exclusive-OR gate performing a logic exclusive-OR operation on the output data of an output terminal of the first D-type flip-flop circuit and the output data of an output terminal of the second D-type flip-flop circuit to output a control signal indicating the result of the exclusive-OR operation, wherein when a logic level of the output data of the output terminal of the first D-type flip-flop circuit and that of the output data of the output terminal of the second D-type flip-flop circuit are identical, a logic level of the control signal is at a low logic level, wherein when the logic level of the output data of the output terminal of the first D-type flip-flop circuit and that of the output data of the output terminal of the second D-type flip-flop circuit are not identical, the logic level of the control signal is at a high logic level.

7. The synchronization circuit as defined in claim 6, wherein the resynchronization circuit further comprises a two-input logic AND gate performing a logic AND operation on the control signal and the second delay synchronization signal to output an adaptive second delay clock as a result, wherein when the control signal is in the high logic level, the adaptive second delay clock corresponding to the second delay synchronization signal is generated.

8. The synchronization circuit as defined in claim 7, wherein the resynchronization circuit further comprises a two-input logic OR gate performing a logic OR operation on the input synchronization signal and the adaptive second delay clock to output a main clock as a result, wherein the main clock generated by the two-input logic OR gate is applied to a clock terminal of the first D-type flip-flop circuit.

9. The synchronization circuit as defined in claim 1, wherein the first synchronization circuit is a first latch circuit, and the second synchronization circuit is a second latch circuit.

10. The synchronization circuit as defined in claim 1, wherein the resynchronization circuit comprises:
a two-input logic exclusive-OR gate, performing a logic exclusive-OR operation on an i-th bit of the first output data and an i-th bit of the second output data to output an i-th bit of a preliminary control signal; and
a n-input logic OR gate, performing a logic OR operation on the preliminary control signal to generate a result control signal, wherein the result control signal is applied to one of input terminals of a two-input logic AND gate.

11. A semiconductor device comprising the synchronization circuit as defined in claim 1.

12. A synchronization method comprising:

comparing a first data generated by synchronizing an input data with a synchronization signal to a second data generated by synchronizing the input data with a delayed synchronization signal to generate a comparison result, wherein the delayed synchronization signal is generated by delaying the synchronization signal; and when the comparison result indicates that the first data is inconsistent with the second data, outputting data generated by synchronizing the input data with a more-delayed synchronization signal, and outputting the first data otherwise, wherein the more-delayed synchronization signal is generated by delaying the delayed synchronization signal.

13. The synchronization method as defined in claim 12, wherein:

the input data comprises a plurality of bits;

comparing each bit of the first data to a corresponding bit of the second data to generate the comparison result in the comparing step; and when the comparison result indicates that at least one bit of the first data is inconsistent with the corresponding bit of the second data, outputting the data generated by synchronizing the input data with the more-delayed synchronization signal in the outputting step, and outputting the first data otherwise.

* * * * *